United States Patent
Heppner et al.

(10) Patent No.: US 9,172,160 B2
(45) Date of Patent: Oct. 27, 2015

(54) VERTICAL SOCKET CONTACT WITH FLAT FORCE RESPONSE

(71) Applicant: Intel Corporation, Santa Clara, CA (US)

(72) Inventors: Joshua D Heppner, Chandler, AZ (US); Sriram Srinivasan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 100 days.

(21) Appl. No.: 13/801,730

(22) Filed: Mar. 13, 2013

(65) Prior Publication Data

US 2014/0273553 A1  Sep. 18, 2014

(51) Int. Cl.
*H01R 12/00* (2006.01)
*H01R 12/70* (2011.01)
*H01R 12/71* (2011.01)
*H01R 13/24* (2006.01)
*G01R 1/04* (2006.01)
*G01R 1/067* (2006.01)

(52) U.S. Cl.
CPC .......... *H01R 12/7076* (2013.01); *G01R 1/0466* (2013.01); *H01R 12/714* (2013.01); *H01R 12/716* (2013.01); *H01R 13/2471* (2013.01); *G01R 1/06727* (2013.01); *G01R 1/06733* (2013.01); *Y10T 29/49204* (2015.01)

(58) Field of Classification Search
CPC ..................................................... H01R 23/722

USPC ............................................................ 439/66
See application file for complete search history.

(56) References Cited

U.S. PATENT DOCUMENTS

| | | | | |
|---|---|---|---|---|
| 4,636,026 A * | 1/1987 | Cooney et al. | ............... | 439/482 |
| 4,838,801 A * | 6/1989 | Bertoglio et al. | ............... | 439/83 |
| 5,192,213 A * | 3/1993 | Kosugi et al. | ................... | 439/66 |
| 5,221,209 A * | 6/1993 | D'Amico | ........................ | 439/71 |
| 5,362,241 A * | 11/1994 | Matsuoka et al. | .............. | 439/66 |
| 6,814,626 B2 * | 11/2004 | Wen-Yao | ...................... | 439/700 |
| 7,201,584 B1 * | 4/2007 | Ju et al. | ............................ | 439/71 |
| 7,261,568 B2 * | 8/2007 | Ju et al. | ............................ | 439/66 |
| 7,473,104 B1 * | 1/2009 | Wertz | ................................ | 439/66 |
| 7,559,806 B2 * | 7/2009 | Lin et al. | ........................ | 439/700 |
| 7,794,237 B1 * | 9/2010 | Terhune, IV | ..................... | 439/71 |
| 7,938,649 B2 * | 5/2011 | Gattuso | ............................ | 439/71 |
| 8,147,253 B2 * | 4/2012 | Goodman et al. | .............. | 439/66 |
| 8,210,855 B1 * | 7/2012 | Lin | ................................ | 439/66 |
| 8,441,275 B1 * | 5/2013 | Alladio | ..................... | 324/756.02 |
| 8,888,502 B2 * | 11/2014 | Terhune, IV | ..................... | 439/66 |
| 8,894,422 B2 * | 11/2014 | Yeh et al. | ........................ | 439/83 |

* cited by examiner

*Primary Examiner* — Neil Abrams
(74) *Attorney, Agent, or Firm* — Schwegman Lundberg & Woessner, P.A.

(57) ABSTRACT

An apparatus includes a plurality of contact elements to provide electrical continuity between an integrated circuit and an electronic subassembly, wherein a contact element includes a spring element and a separate lead element, wherein the spring element is arranged to be substantially vertically slidable over at least a portion of the lead element in response to a force applied to the contact element.

19 Claims, 5 Drawing Sheets

VERTICAL SOCKET CONTACT WITH FLAT FORCE RESPONSE

TECHNICAL FIELD

Embodiments pertain to packaging of integrated circuits. Some embodiments relate to integrated circuit sockets.

BACKGROUND

Electronic systems often include integrated circuits (ICs) that are connected to a subassembly such as a substrate or motherboard. The ICs can be packaged and inserted into an IC socket that is mounted on the subassembly. As electronic system designs become more complex, it is a challenge to meet the desired size constraints of the system. One aspect that influences the overall size of a design is the spacing required for the interconnection of the pins or contacts of the IC sockets. Additionally, as the spacing is reduced, the IC sockets become less robust and have difficulty surviving the high number of cycles of installation and removal during test of a packaged IC. Thus there are general needs for devices, systems and methods that reduce the spacing needed for contacts of IC sockets yet provide a robust design.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
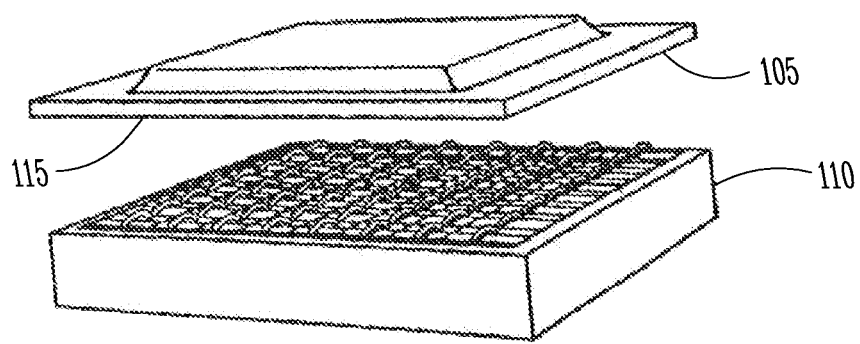
FIG. 1 shows an illustration of a packaged IC and an IC socket.

FIG. 1 shows an illustration of a packaged IC 105 and an IC socket 110. The packaged IC 105 can include an array or grid of contacts on the bottom surface 115. The IC socket 110 includes contacts on the top surface to provide electrical continuity between the IC and a subassembly such as a motherboard for example. As the pitch size of contacts of packaged ICs continues to decrease, it is becoming a challenge to meet the space limitations on IC sockets. Additionally, if the IC socket is part of a testing system, the contacts of an IC socket need to be robust enough to handle many cycles of receiving a packaged IC without having a connection problem.

Figure 2:
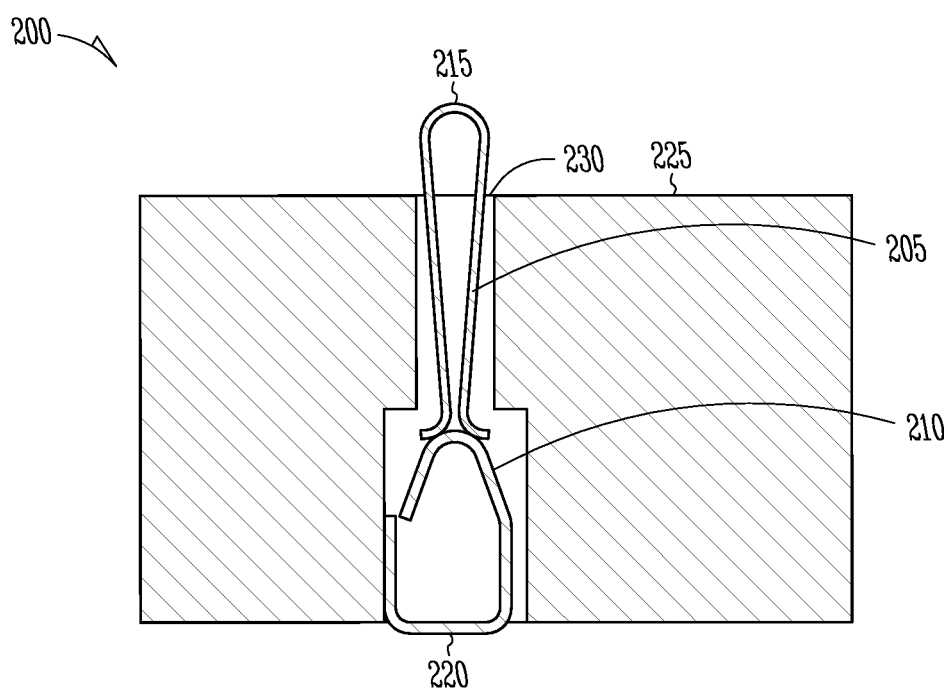
FIG. 2 illustrates an example of a contact element for an IC socket in accordance with some embodiments.

FIG. 2 illustrates an example of a contact element 200 for an IC socket. An IC can include a plurality of land contacts arranged in a grid or matrix. An IC socket can include a plurality of the contact elements arranged in a grid or matrix to match the land contacts of the IC. The contact elements provide electrical continuity between the integrated circuit and an electronic subassembly. The contact element 200 includes a spring element 205 and a separate lead element 210. The spring element 205 is arranged in the IC socket to be substantially vertically slidable over or onto at least a portion of the lead element in response to a force applied to the contact element 200.

In the example embodiment shown, the spring element 205 includes a bend to form a substantially looped portion 215 at a first end of the spring element 205 and a gapped portion at a second end of the spring element 205. The resulting shape of the spring element 205 may resemble a clothes pin. The looped portion 215 is arranged (e.g., by shape and size) to engage a land contact of the IC. The lead element 210 includes a J-shaped portion. The gapped portion of the spring element 205 is arranged to be substantially vertically slidable over at least a portion of the J-shaped portion of the lead element 210 in response to a force applied at the looped portion 215 of the spring element 205. Stated another way, the clothespin shape opens outwards as the spring element 205 is pressed down on the J-lead portion to create force and to create an electrical connection. The lead element 210 may include a contact pad 220 area, such as to accommodate attachment of a solder ball for example, for electrical connection to a subassembly.

Typical IC sockets may use a cantilever arm as a contact. Mounting an IC to a cantilever type of contact includes applying a horizontal component of force across an IC pad. The horizontal force is applied with a horizontal motion that is sometimes referred to as a "wipe." This horizontal motion extends the size of the footprint needed for the contact, which increases the spacing required in contrast to the substantially vertical design of the example in FIG. 2.

The contact element 200 has a low and flat force response which is advantageous in being able to control the system level force as well as having a known controllable contact resistance between the packaged IC and the IC socket. The low force response allows the contact element 200 to maintain sufficient force throughout its lifetime with little degradation.

Figure 3:
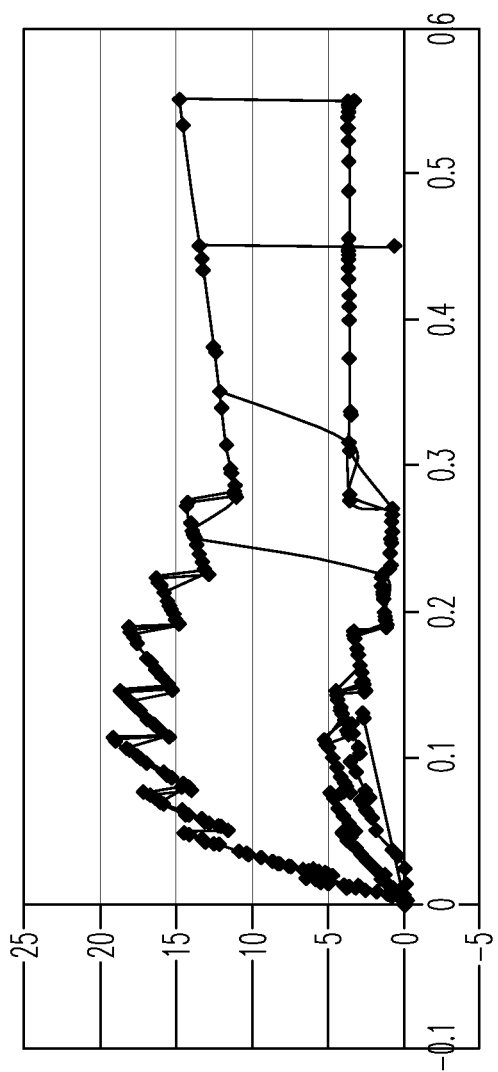
FIG. 3 shows a force-deflection curve for a contact element in accordance with some embodiments.

FIG. 3 shows a force-deflection curve for the contact element 200. The Y-axis represents force in grams and the X-axis represents deflection in micrometers ($\mu$m). The curve shows three cycles of deflection superimposed on one graph. The sawtooth shape evident early in the cycles is force due to friction. The graph shows that the deflection response is fairly flat for an applied force. The graph shows that the working range for the contact element 200 in FIG. 2 is 520 $\mu$m at a deflection of 550 $\mu$m with a corresponding force of 15 grams. The working range for a cantilever contact at the same deflection is only about 300 $\mu$m and has a force of about 27 grams. The larger deflection allows an IC socket with the contact elements of FIG. 2 to accommodate packaged ICs with a greater degree of warp-age, which increases usable yield of the packaged ICs. The low force response and no evident material yield suggest that the design space for the contact element 200 is large and may be scaled to a variety of pitches and heights.

Because the contact element 200 of FIG. 2 provides a straight path between the subassembly and the packaged IC, the contact element may improve performance of high speed input output (HSIO) over previous approaches. With a cantilever type of contact, the land contact area of the IC, and thus the capacitance of the land contact, may be defined by the extent of the wipe needed to make the connection between the IC land contact and the IC socket contact. Thus, the capacitance of the land contact is determined by mechanical constraints. Because the contact element 200 in FIG. 2 needs little or no wipe, the capacitance of the land contact may be separated from mechanical considerations and the capacitance of the land contact can be determined by electrical considerations, such as to tune the value of the capacitance to improve performance of an HSIO interface. While the device can be no-wipe and include no horizontal motion to make a connection between the IC land contact and the contact element 200, the contact element 200 may also be designed to have a well-controlled wipe for the connection based on asymmetry designed into the contact element 200, such as by asymmetry designed into the beams or arms of the spring element.

The IC socket for the contact element 200 includes a body 225 having a plurality of guide openings to contain a plurality of the contact elements. In certain examples the body 225 is a liquid crystal polymer (LCP) housing. The positions of the guide openings can correspond to the grid positions of the land contacts of the IC. The body 225 of the IC socket includes a first surface (e.g., a top surface) and a second surface (e.g., a bottom surface) opposite the first surface. A guide opening 230 extends from the first surface to the second surface.

The guide opening 230 may function as a guide for the vertical displacement of the contact element 200. The spring element 205 is arranged to be substantially vertically slidable over the at least a portion of the lead element within the guide opening in response to a force applied to the contact element in a direction substantially perpendicular to the first surface. The spring element 205 may be sized to extend above the first surface. Applying the IC contact to the first surface of the body of the IC socket displaces the spring element to apply a force to slide over at a portion of the lead element. The contact pad 220 may have a contact surface that extends beyond the second surface of the body 225. Electrical continuity is provided through the guide opening between the looped portion 215 and the contact pad 220.

In the example shown in FIG. 2, the guide opening 230 includes a first portion having a first width and a second portion having a second width that is greater than the first portion. The spring element 205 extends from the first surface through the first portion of the guide opening to the second portion of the guide opening. The lead element 210 engages the spring element 205 in the second portion. The gapped portion of the spring element 205 can include a flare or have ends that are flared away from each other. The flare may have a width greater than the first width and less than the second width. This may be useful for retaining of the spring element 205 within the first portion of the guide opening.

In some embodiments, the IC socket that includes the contact element 200 of FIG. 2 may be mounted to provide electrical continuity with a printed circuit board (PCB) (e.g., a motherboard), and the IC socket receives a packaged IC that includes a processor circuit. The processor circuit and the PCB may be included in a tablet computer. In some embodiments, the IC socket is included in a test fixture. The test fixture includes a PCB and the IC socket. The IC socket includes a plurality of the contact elements to provide electrical communication between an IC and the PCB. As explained previously herein, the contact element 200 provides a robust design that can accommodate many cycles of IC installation, testing and IC removal.

Figure 4:
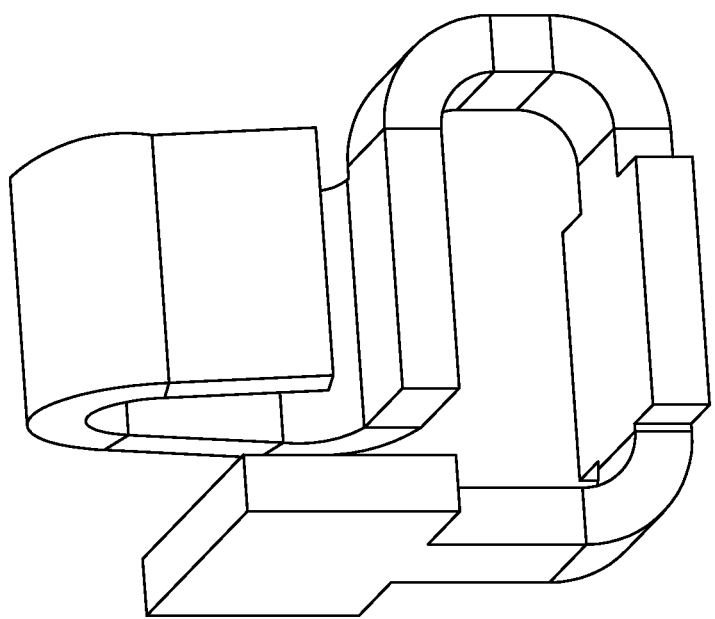
FIG. 4 shows additional examples of embodiments of a contact element in accordance with some embodiments.
Figure 4:
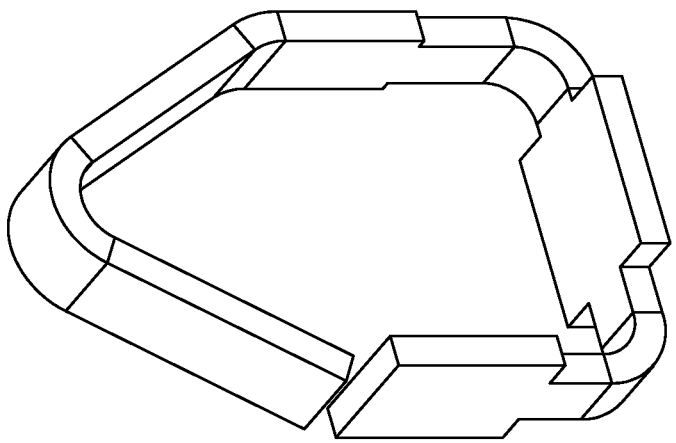
Figure 4:
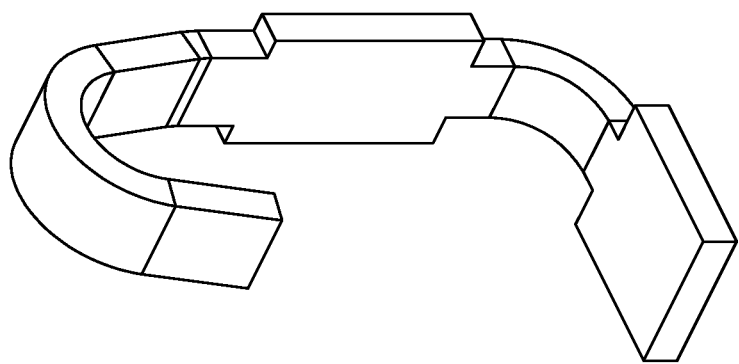

FIG. 4 shows additional examples of embodiments of the lead element. The embodiments include a J-shaped portion to engage the spring element. The lead elements include different configurations of contact pads for electrical connection to the subassembly.

Figure 5:
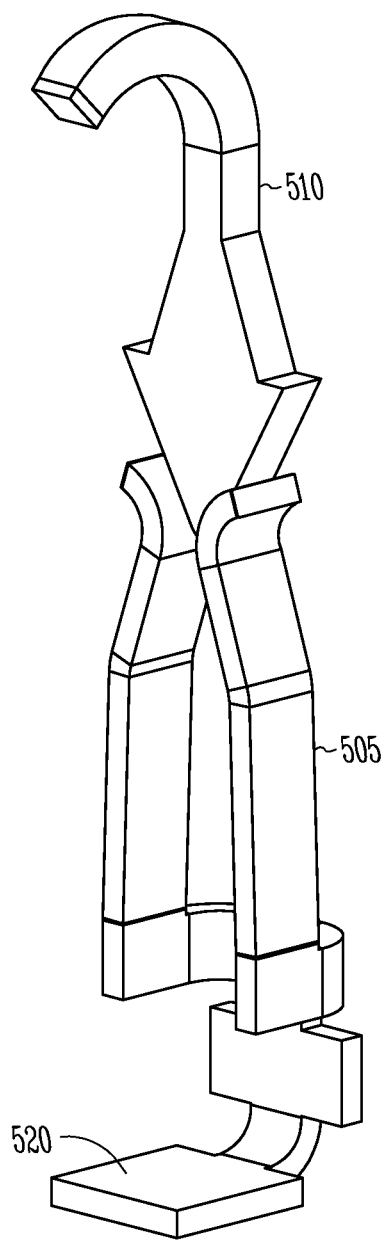
FIG. 5 illustrates another example of a contact element for an IC socket in accordance with some embodiments.

FIG. 5 illustrates another example of an embodiment of a contact element 500 for an IC socket. The example includes a separate lead element 510 and spring element 505, but the lead element 510 contacts the packaged IC and the spring element 505 contacts the electronic subassembly. The lead element 510 includes a substantially J-shaped portion that is arranged to engage a land contact of the IC, and includes a substantially V-shaped or arrow-head shaped portion arranged opposite the J-shaped portion. The spring element 505 includes a first spring arm and a second spring arm opposite the first spring arm. The first and second spring arms of the spring element 505 are arranged to be substantially vertically slidable over at least a portion of the V-shaped portion of the lead element 510 in response to a force applied to the J-shaped portion of the lead element 510.

Similar to the example in FIG. 2, the IC socket includes an IC socket body (not shown in FIG. 5) that includes a first surface and a second surface opposite the first surface. The body includes a plurality of guide openings to contain a plurality of the contact elements, and the guide openings extend from the first surface to the second surface. The J-shaped portion of the lead element 510 extends beyond the first surface to engage the land contact of the IC. The spring element 505 may include a contact pad 520 area, such as to accommodate attachment of a solder ball for example. The contact pad area may have a contact surface extending beyond the second surface of the body.

Figure 6:
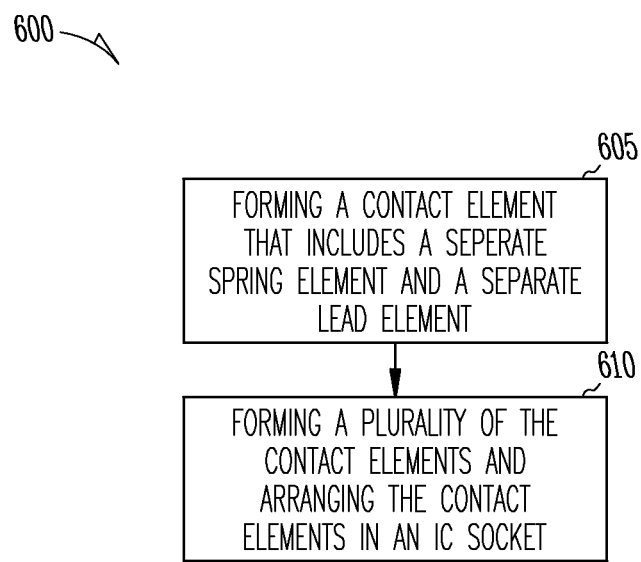
FIG. 6 shows an example of a flow diagram of a method of making a contact element in accordance with some embodiments.

FIG. 6 shows an example of a flow diagram of a method 600 of making a contact element. At block 605, a contact element is formed that includes a separate spring element and a separate lead element. The spring element is formed to be substantially vertically slidable over at least a portion of the lead element in response to a force applied to the contact element. At block 610, a plurality of the contact elements are formed and arranged in an IC socket body to provide electrical continuity between an IC and an electronic subassembly. The IC may be a packaged IC that includes a plurality of land contacts arranged in a grid. Arranging the contact elements of the IC socket can include arranging the contact elements in the IC socket to match the grid of the land contacts of the packaged IC. The electronic subassembly may include a motherboard of a computing device. The electronic subassembly may include a PCB for test fixture.

An example of a contact element is shown in FIG. 2. Forming the lead element 210 and the spring element 205 can include stamping the lead element 210 and the spring element 205. In some embodiments, the method 600 includes forming the lead element to include a bend in a first length of electrically conductive material to form a substantially J-shaped portion of the lead element. In certain embodiments, the lead element includes four bends made to the length of electrical conducting material. In some embodiments, the method 600 includes forming the spring element to include a bend in a second length of electrically conductive material to form a substantially looped portion of the spring element and forming a gap between a first end and a second end of the second length of electrically conductive material. Forming the gap may include sizing the gap to slidably engage at least a portion of the J-shaped portion of the lead element in response to a substantially vertical force applied to the contact element. In certain embodiments, the spring element includes three bends made to the length of electrical conducting material.

In some embodiment, the method 600 includes forming the body for the IC socket. In certain embodiments, the body is formed using LCP. The body includes a first surface and a second surface opposite the first surface. A plurality of guide openings are formed in the body that extend from the first surface to the second surface. Contact elements are placed in the guide openings. The looped portion 215 of the spring element of the contact element extends beyond the first surface of the IC socket body. In certain embodiments, a layer of gold is added to an area of the top of the looped portion that will contact a land contact of an IC. The lead element includes an electrical contact that extends beyond the second surface of the body. In some embodiments, a contact pad 220 is formed on the lead element. In certain embodiments, a solder ball is attached to the contact pad 220.

The guide opening may have a uniform width, or the guide openings may be formed to have multiple widths. In some embodiments, a guide opening is formed to have a first portion with a first width and a second portion with a second width that is wider than the first width. The lead element 210 may be placed in the second portion, and the spring element 205 may be arranged to extend through the first portion to the second portion to engage the lead element 210. It can be seen that the contact elements can be made more inexpensively than an IC socket design that includes a pogo pin approach.

Another example of a contact element is shown in FIG. 5. In some embodiments, the method of FIG. 6 includes forming the lead element to include a substantially J-shaped portion of the lead element 510 at a first end of the lead element and to include a substantially V-shaped portion of the lead element at a second end of the lead element 510. In some embodiments, the method 600 includes forming the spring element by joining a first spring arm to a second spring arm with the first spring arm opposing the second spring arm. The first and second spring arms of the spring element 505 are arranged to be substantially vertically slidable over at least a portion of the substantially V-shaped portion of the lead element 510 in response to a force applied to the J-shaped portion of the lead element.

Similar to the example in FIG. 2, an IC socket body is formed and a plurality of guide openings are formed in the IC socket body that extend from a first surface of the IC socket body to a second surface of the IC socket body. Contact elements are placed in the guide openings such that the J-shaped portion of the lead element 510 extends beyond the first surface of the IC socket body. A layer of gold may be added to an area of the J-shaped portion that contacts a land contact of an IC. The spring element 505 includes a contact surface extending beyond the second surface of the IC socket body. A contact pad 520 may be formed on the spring element, and a solder ball may be attached to the contact pad 520.

Similar to the example in FIG. 2, the guide openings of the IC socket body may have a uniform width, or the guide openings may be formed to have multiple widths. In some embodiments, a guide opening is formed to have a first portion with a first width and a second portion with a second width that is narrower than the first width. The lead element 510 may be placed in the first portion and arranged to extend beyond the first surface (e.g., a top surface). The spring element 505 may be arranged to extend from the second surface (e.g., a bottom surface) through the second narrower portion to the first portion to engage the lead element 510.

The several examples of devices, systems and methods described herein reduce the disadvantages of other IC sockets by incorporating a contact element that responds to a small force that is substantially vertical. The vertical approach improves mechanical performance of contacts and reduces the space required, thereby allowing the pitch between contacts to be reduced.

Although the examples have been described in relation to an IC that includes a processing element, the contact elements and IC sockets described herein may be used with other types of ICs, such as digital signal processors (DSPs), application specific integrated circuits (ASICs), memory ICs, and radio-frequency integrated circuits (RFICs) for example. Additionally, the contact elements described may be used to provide electrical continuity between electronic subsystems, such as between a multichip module and a motherboard of a computing device for example.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

ADDITIONAL EXAMPLES

Example 1 can include subject matter (such as an apparatus) including a plurality of contact elements to provide electrical continuity between as integrated circuit and an electronic subassembly. A contact element can include a spring element and a separate lead element. The spring element can be arranged to be substantially vertically slidable over at least a portion of the lead element in response to a force applied to the contact element.

In Example 2, the subject matter of Example 1 can optionally include a spring element having a bend to form a substantially looped portion at a first end of the spring element and a gapped portion at a second end of the spring element. The looped portion can be arranged to engage a land contact of the integrated circuit. The subject matter may also optionally include a lead element having a J-shaped portion. The gapped portion of the spring element can be arranged to be substantially vertically slidable over at least a portion of the J-shaped portion of the lead element in response to a force applied at the looped portion of the spring element.

In Example 3, the subject matter of one or a combination of Examples 1 and 2 can optionally include a body. The body includes a first surface and a second surface opposite the first surface. The body can include a plurality of guide openings to contain the plurality of contact elements, wherein a guide opening extends from the first surface to the second surface.

In Example 4, the subject matter of Example 3 can optionally include a guide opening including a first portion having a first width and a second portion having a second width greater than the first width. The spring element can extend from the first surface through the first portion to the second portion and the lead element engages the spring element in the second portion.

In Example 5, the subject matter of Example 4 optionally includes the gapped portion of the spring element including a flare having a width greater than the first width and less than the second width.

In Example 6, the subject matter of one or any combination of Examples 3-5 optionally includes a lead element that includes a contact surface extending beyond the second surface.

In Example 7, the subject matter of Example 1 optionally includes a lead element including a substantially J-shaped portion arranged to engage a land contact of the integrated circuit and a substantially V-shaped portion arranged opposite the J-shaped portion. The subject matter optionally includes a spring element including a first spring arm and a second spring arm opposite the first spring arm. The first and second spring arms of the spring element can be arranged to be substantially vertically slidable over at least a portion of the V-shaped portion of the lead element in response to a force applied to the J-shaped portion of the lead element.

In Example 8, the subject matter of any one or a combination of examples 1 and 7 optionally includes a body. The body can be arranged to receive the integrated circuit. The body can include a first surface, a second surface opposite the first surface, and a plurality of guide openings to contain the plurality of contact elements. A guide opening can extend from the first surface to the second surface. The J-shaped portion of the lead element of a contact element can extend beyond the first surface to engage the land contact of the integrated circuit, and the spring element of a contact element can include a contact surface extending beyond the second surface.

In Example 9, the subject matter of one or any combination of Examples 1 and 2 optionally includes a body. The body can include a first surface, a second surface opposite the first surface, and a plurality of guide openings to contain the plurality of contact elements. A guide opening can extend from the first surface to the second surface. The spring element of a contact element can be arranged to be substantially vertically slidable over the at least a portion of the lead element within the guide opening in response to a force applied to the contact element in a direction substantially perpendicular to the first surface.

In Example 10, the subject matter of one or any combination of Examples 1-9 can optionally include the contact elements arranged in a grid to match a grid of land contacts of an integrated circuit.

Example 11 can include subject matter, or can optionally be combined one or any combination of Examples 1-10 to include subject matter (such as a text fixture), including a printed circuit board (PCB) and an integrated (IC) socket in electrical communication with the PCB. The IC socket can include a plurality of contact elements to provide electrical continuity between an integrated circuit and the PCB, wherein a contact element includes a spring element and a separate lead element, and wherein the spring element is arranged to be substantially vertically slidable over at least a portion of the lead element in response to a force applied to the contact element.

In Example 12, the subject matter of Example 11 can optionally include a spring element that includes a bend to form a substantially looped portion and a gap between a first end and a second end. The looped portion can be arranged to engage a land contact of the integrated circuit. The subject matter can include a lead element having a J-shaped portion. The first end and the second end of the spring element can be arranged to be substantially vertically slidable over at least a portion of the J-shaped portion of the lead element in response to a force applied at the looped portion of the spring element.

In Example 13, the subject matter of one or any combination of Examples 11 and 12 can optionally include an IC socket having a body. The IC socket body can include a first surface, a second surface opposite the first surface, and a plurality of guide openings to contain the plurality of contact elements. A guide opening can extend from the first surface to the second surface.

In Example 14, the subject matter of Example 13 can optionally include a guide opening of the plurality of guide openings that includes a first portion having a first width and a second portion having a second width greater than the first width. The spring element extends from the first surface through the first portion to the second portion and the lead element engages the spring element in the second portion. The first end and the second end of the spring element can be flared away from each other to extend to a width greater than the first width and less than the second width.

Example 15 can include subject matter, or can optionally be combined one or any combination of Examples 1-14 to include subject matter (such as a system) including a PCB, an IC including a processor circuit, and an IC socket mounted on the PCB and arranged to provide electrical continuity between the IC and the PCB. The IC socket can include a plurality of contact elements to provide electrical continuity between the IC and the PCB, wherein a contact element includes a spring element and a separate lead element, and wherein the spring element is arranged to be substantially vertically slidable over at least a portion of the lead element in response to a force applied to the contact element.

In Example 16, the subject matter of Example 15 can optionally include a spring element including a bend to form a substantially looped portion and a gap between a first end and a second end, wherein the looped portion is arranged to engage a land contact of the integrated circuit. The lead element optionally includes a J-shaped portion, wherein the first end and the second end of the spring element are arranged to be substantially vertically slidable over at least a portion of the J-shaped portion of the lead element in response to a force applied at the looped portion of the spring element.

In Example 17, the subject matter of Example 16 optionally includes an IC socket having a body. The IC socket body can include a first surface, a second surface opposite the first surface, and a plurality of guide openings to contain the plurality of contact elements, wherein a guide opening extends from the first surface to the second surface. The looped portion of the spring element extends from the first surface, and wherein the lead element includes a contact surface extending beyond the second surface.

In Example 18, the subject matter of one or any combination of Examples 15 and 16 optionally includes an IC socket having a body. The IC socket body can include a first surface, a second surface opposite the first surface, and a plurality of guide openings to contain the plurality of contact elements, wherein a guide opening extends from the first surface to the second surface. A guide opening can extend from the first surface to the second surface, and the guide opening can include a first portion having a first width and a second portion having a second width greater than the first width, and wherein the spring element extends from the first surface through the first portion to the second portion and the lead element engages the spring element in the second portion.

Example 19 can include subject matter, or can optionally be combined one or any combination of Examples 1-10 to include subject matter (such as a method, means for performing acts, or a machine readable medium that can cause the machine to perform acts) including forming a contact element that includes a separate spring element and a separate lead element, wherein the spring element is formed to be substantially vertically slidable over at least a portion of the lead element in response to a force applied to the contact element, and forming a plurality of the contact elements and arranging the contact elements in an IC socket body to provide electrical continuity between an integrated circuit and an electronic subassembly.

In Example 20, the subject matter of Example 19 can include forming the lead element to include a bend in a first length of electrically conductive material to form a substantially J-shaped portion of the lead element, forming the spring element to include a bend in a second length of electrically conductive material to form a substantially looped portion of the spring element, and forming a gap between a first end and a second end of the second length of electrically conductive material. Forming the gap of the spring element can include sizing the gap to slidably engage at least a portion of the J-shaped portion of the lead element in response to a substantially vertical force applied to the contact element.

In Example 21, the subject matter of Example 20 can include forming the body for the IC socket, wherein the body includes a first surface and a second surface opposite the first surface, and a plurality of guide openings in the body that extend from the first surface to the second surface, and placing a contact element in a guide opening, wherein the looped portion of the spring element of the contact element extends beyond the first surface, and wherein the lead element includes an electrical contact that extends beyond the second surface.

In Example 22, the subject matter of Example 19 can optionally include forming the lead element to include a substantially J-shaped portion of the lead element at a first end of the lead element and to include a substantially V-shaped portion of the lead element at a second end of the lead element, and forming the spring element by joining a first spring arm to a second spring arm with the first and second spring arms opposing. The first and second spring arms of the spring element are arranged to be substantially vertically slidable over at least a portion of the substantially V-shaped portion of the lead element in response to a force applied to the J-shaped portion of the lead element.

In Example 23, the subject matter of Example 22 can optionally include forming the body for the IC socket, wherein the body includes a first surface and a second surface opposite the first surface, and a plurality of guide openings in the body that extend from the first surface to the second surface, and placing a contact element in a guide opening, wherein the J-shaped portion of the lead element of a contact element extends beyond the first surface, and wherein the spring element of a contact element includes a contact surface extending beyond the second surface.

Example 24 can include, or can optionally be combined with any portion or combination of any portions of any one or more of Examples 1 through 23 to include, subject matter that can include means for performing any one or more of the functions of Examples 1 through 20, or a machine-readable medium including instructions that, when performed by a machine, cause the machine to perform any one or more of the functions of Examples 1 through 20.

Each of these non-limiting examples can stand on its own, or can be combined in various permutations or combinations with one or more of the other examples.

What is claimed is:

1. An apparatus to contact an integrated circuit, the apparatus comprising:
   a plurality of contact elements to provide electrical continuity between an integrated circuit and an electronic subassembly, wherein a contact element includes a spring element and a separate lead element that includes a substantially J-shaped portion, wherein the spring element is arranged to be substantially vertically slidable over at least a portion of the lead element in response to a force applied to the contact element;
   wherein the spring element includes a bend to form a substantially looped portion at a first end of the spring element and a gapped portion at a second end of the spring element, wherein the looped portion is arranged to engage a land contact of the integrated circuit; and
   wherein the gapped portion of the spring element is arranged to be substantially vertically slidable over at least a portion of the J-shaped portion of the lead element in response to a force applied at the looped portion of the spring element.

2. The apparatus of claim 1, including a body, wherein the body includes:
   a first surface and a second surface opposite the first surface; and
   a plurality of guide openings to contain the plurality of contact elements, wherein a guide opening extends from the first surface to the second surface.

3. The apparatus of claim 2,
   wherein the guide opening includes a first portion having a first width and a second portion having a second width greater than the first width, and
   wherein the spring element extends from the first surface through the first portion to the second portion and the lead element engages the spring element in the second portion.

4. The apparatus of claim 3, wherein the gapped portion of the spring element includes a flare having a width greater than the first width and less than the second width.

5. The apparatus of claim 2, wherein the lead element includes a contact surface extending beyond the second surface.

6. The apparatus of claim 1, including a body, wherein the body includes:
   a first surface and a second surface opposite the first surface; and
   a plurality of guide openings to contain the plurality of contact elements, wherein a guide opening extends from the first surface to the second surface, and wherein the spring element of a contact element is arranged to be substantially vertically slidable over the at least a portion of the lead element within the guide opening in response to a force applied to the contact element in a direction substantially perpendicular to the first surface.

7. The apparatus of claim 1, wherein the integrated circuit includes a plurality of land contacts arranged in a grid, and wherein the contact elements are arranged in a grid to match the land contacts of the integrated circuit.

8. An apparatus to contact an integrated circuit, the apparatus comprising:
   a plurality of contact elements to provide electrical continuity between an integrated circuit and an electronic subassembly, wherein a contact element includes a spring element and a separate lead element that includes a substantially J-shaped portion, wherein the spring element is arranged to be substantially vertically slidable over at least a portion of the lead element in response to a force applied to the contact element;
   wherein the substantially J-shaped portion is arranged to engage a land contact of the integrated circuit and the lead element further includes a substantially V-shaped portion arranged opposite the J-shaped portion;
   wherein the spring element includes a first spring arm and a second spring arm opposite the first spring arm, and
   wherein the first and second spring arms of the spring element are arranged to be substantially vertically slidable over at least a portion of the V-shaped portion of the lead element in response to a force applied to the J-shaped portion of the lead element.

9. The apparatus of claim 8, including a body, wherein the body includes:
   a first surface and a second surface opposite the first surface; and a plurality of guide openings to contain the plurality of contact elements, wherein a guide opening extends from the first surface to the second surface, and wherein the J-shaped portion of the lead element of a contact element extends beyond the first surface to engage the land contact of the integrated circuit, and wherein the spring element of a contact element includes a contact surface extending beyond the second surface.

10. A test fixture comprising:

a printed circuit board (PCB); and an integrated circuit (IC) socket in electrical communication with the PCB, wherein the IC socket includes:

a plurality of contact elements to provide electrical continuity between an integrated circuit and the PCB, wherein a contact element includes a spring element and a separate lead element that includes a substantially J-shaped portion, and wherein the spring element is arranged to be substantially vertically slidable over at least a portion of the lead element in response to a force applied to the contact element;

wherein the spring element includes a bend to form a substantially looped portion and a gap between a first end and a second end, wherein the looped portion is arranged to engage a land contact of the integrated circuit; and wherein the first end and the second end of the spring element are arranged to be substantially vertically slidable over at least a portion of the J-shaped portion of the lead element in response to a force applied at the looped portion of the spring element.

11. The test fixture of claim 10, wherein the IC socket includes a body, the body including:

a first surface and a second surface opposite the first surface; and a plurality of guide openings to contain the plurality of contact elements, wherein a guide opening extends from the first surface to the second surface.

12. The test fixture of claim 11, wherein a guide opening of the plurality of guide openings includes a first portion having a first width and a second portion having a second width greater than the first width, wherein the spring element extends from the first surface through the first portion to the second portion and the lead element engages the spring element in the second portion, and wherein the first end and the second end of the spring element are flared away from each other to extend to a width greater than the first width and less than the second width.

13. An electronic system comprising:

a PCB;

an IC including a processor circuit; and an IC socket mounted on the PCB and arranged to provide electrical continuity between the IC and the PCB, wherein the IC socket includes a plurality of contact elements to provide electrical continuity between the IC and the PCB, wherein a contact element includes a spring element and a separate lead element that includes a substantially J-shaped portion, wherein the spring element is arranged to be substantially vertically slidable over at least a portion of the lead element in response to a force applied to the contact element;

wherein the spring element includes a bend to form a substantially looped portion and a gap between a first end and a second end, wherein the looped portion is arranged to engage a land contact of the integrated circuit, and wherein the first end and the second end of the spring element are arranged to be substantially vertically slidable over at least a portion of the J-shaped portion of the lead element in response to a force applied at the looped portion of the spring element.

14. The electronic system of claim 13, wherein the IC socket includes a body, wherein the body includes:

a first surface and a second surface opposite the first surface; and a plurality of guide openings to contain the plurality of contact elements, wherein a guide opening extends from the first surface to the second surface, wherein the looped portion of the spring element extends from the first surface, and wherein the lead element includes a contact surface extending beyond the second surface.

15. The electronic system of claim 13, wherein the IC socket includes a body, wherein the body includes:

a first surface and a second surface opposite the first surface; and a plurality of guide openings to contain the plurality of contact elements, wherein a guide opening extends from the first surface to the second surface, wherein the guide opening includes a first portion having a first width and a second portion having a second width greater than the first width, and wherein the spring element extends from the first surface through the first portion to the second portion and the lead element engages the spring element in the second portion.

16. A method of making a device to contact an integrated circuit, the method comprising:

forming a contact element that includes a separate spring element and a separate lead element that includes a substantially J-shaped portion, wherein the spring element is formed to be substantially vertically slidable over at least a portion of the lead element in response to a force applied to the contact element;

forming a plurality of the contact elements and arranging the contact elements in an IC socket body to provide electrical continuity between an integrated circuit and an electronic subassembly;

forming the lead element to include a bend in a first length of electrically conductive material to form a substantially J-shaped portion of the lead element;

forming the spring element to include a bend in a second length of electrically conductive material to form a substantially looped portion of the spring element and forming a gap between a first end and a second end of the second length of electrically conductive material, and wherein forming the gap of the spring element includes sizing the gap to slidably engage at least a portion of the J-shaped portion of the lead element in response to a substantially vertical force applied to the contact element.

17. The method of claim 16, including:

forming the body for the IC socket, wherein the body includes a first surface and a second surface opposite the first surface, and a plurality of guide openings in the body that extend from the first surface to the second surface; and placing a contact element in a guide opening, wherein the looped portion of the spring element of the contact element extends beyond the first surface, and wherein the lead element includes an electrical contact that extends beyond the second surface.

18. A method of making a device to contact an integrated circuit, the method comprising:
    forming a contact element that includes a separate spring element and a separate lead element that includes a substantially J-shaped portion, wherein the spring element is formed to be substantially vertically slidable over at least a portion of the lead element in response to a force applied to the contact element;
    forming a plurality of the contact elements and arranging the contact elements in an IC socket body to provide electrical continuity between an integrated circuit and an electronic subassembly;
    forming the lead element to include a substantially J-shaped portion of the lead element at a first end of the lead element and to include a substantially V-shaped portion of the lead element at a second end of the lead element;
    forming the spring element by joining a first spring arm to a second spring arm with the first and second spring arms opposing, wherein the first and second spring arms of the spring element are arranged to be substantially vertically slidable over at least a portion of the substantially V-shaped portion of the lead element in response to a force applied to the J-shaped portion of the lead element.

19. The method of claim 18, including:
    forming the body for the IC socket, wherein the body includes a first surface and a second surface opposite the first surface, and a plurality of guide openings in the body that extend from the first surface to the second surface; and
    placing a contact element in a guide opening, wherein the J-shaped portion of the lead element of a contact element extends beyond the first surface, and wherein the spring element of a contact element includes a contact surface extending beyond the second surface.

\* \* \* \* \*